US009990996B2

(12) United States Patent
Hsiao

(10) Patent No.: US 9,990,996 B2
(45) Date of Patent: Jun. 5, 2018

(54) FLASH MEMORY DATA STORAGE DEVICE AND PROGRAMMING METHOD THEREOF

(71) Applicant: Silicon Motion, Inc., Jhubei, Hsinchu County (TW)

(72) Inventor: Li-Shuo Hsiao, Zhudong Township, Hsinchu County (TW)

(73) Assignee: SILICON MOTION, INC., Jhubei, Hsinchu County (TW)

(*) Notice: Subject to any disclaimer, the term of this patent is extended or adjusted under 35 U.S.C. 154(b) by 0 days. days.

(21) Appl. No.: 15/288,012

(22) Filed: Oct. 7, 2016

(65) Prior Publication Data

US 2017/0115908 A1     Apr. 27, 2017

(30) Foreign Application Priority Data

Oct. 23, 2015  (TW) .............................. 104134820 A

(51) Int. Cl.
| | | |
|---|---|---|
| *G11C 16/04* | (2006.01) | |
| *G06F 3/06* | (2006.01) | |
| *G11C 16/10* | (2006.01) | |
| *G11C 7/10* | (2006.01) | |
| *G06F 12/02* | (2006.01) | |

(52) U.S. Cl.
CPC ............ *G11C 16/04* (2013.01); *G06F 3/0619* (2013.01); *G06F 3/0653* (2013.01); *G06F 3/0659* (2013.01); *G06F 3/0679* (2013.01); *G11C 7/106* (2013.01); *G11C 7/1063* (2013.01); *G11C 7/1087* (2013.01); *G11C 16/10* (2013.01); *G06F 12/02* (2013.01)

(58) Field of Classification Search
CPC .... G06F 3/0619; G06F 3/0679; G06F 3/0653; G06F 3/0659; G11C 7/106; G11C 7/1063; G11C 7/1087; G11C 16/10
See application file for complete search history.

(56) References Cited

U.S. PATENT DOCUMENTS

| | | | |
|---|---|---|---|
| 7,216,183 | B2 | 5/2007 | Ho et al. |
| 8,619,493 | B2 | 12/2013 | Kim |
| 8,909,854 | B2 | 12/2014 | Yamagishi et al. |
| 9,081,662 | B2 | 7/2015 | Teo |
| 2010/0277987 | A1 | 11/2010 | Shinozaki et al. |
| 2013/0128675 | A1* | 5/2013 | Kim .................... G11C 7/10 365/189.05 |
| 2014/0019670 | A1 | 1/2014 | Huang |
| 2014/0129206 | A1 | 5/2014 | Cheng et al. |

(Continued)

FOREIGN PATENT DOCUMENTS

TW              I425515 B         2/2014

*Primary Examiner* — Ajay Ojha
(74) *Attorney, Agent, or Firm* — McClure, Qualey & Rodack, LLP

(57) ABSTRACT

A data storage device includes a flash memory and a controller. The flash memory includes a memory array. The controller performs a programming operation for the flash memory. After the controller issues a program command of the programming operation to the flash memory, the controller issues a first read status command to the flash memory before a page program time of the flash memory has been reached, and the controller determines whether the programming operation is performed in the flash memory according to a first memory status provided by the flash memory.

9 Claims, 3 Drawing Sheets

(56) References Cited

U.S. PATENT DOCUMENTS

2014/0189209 A1* 7/2014 Sinclair .............. G06F 12/0246
 711/103
2016/0267980 A1* 9/2016 Akamine ........... G11C 16/0483
2017/0109059 A1* 4/2017 Kim .................... G06F 3/0611

* cited by examiner

FLASH MEMORY DATA STORAGE DEVICE AND PROGRAMMING METHOD THEREOF

CROSS REFERENCE TO RELATED APPLICATIONS

This Application claims priority of Taiwan Patent Application No. 104134820, filed on Oct. 23, 2015, the entirety of which is incorporated by reference herein.

BACKGROUND OF THE INVENTION

Field of the Invention

The invention relates to a data storage device, and more particularly to a data storage device for detecting a programming operation.

Description of the Related Art

Flash memory is a common non-volatile data storage device, which can be erased and programmed electrically. For example, an NAND flash memory is usually for use in a memory card, a USB flash device, a solid-state disk (SSD), an embedded multimedia card, etc. In recent years, flash memories have been made to have the characteristics of data non-volatility, low power consumption, compact size, and non-mechanical structure. Hence, flash memories have been adapted for use in various electronic devices, especially portable electronic devices.

A flash memory comprises a plurality of blocks, and each block comprises a plurality of pages for data storage. When the flash memory receives a program (write) command from a controller, the flash memory writes data to pages of the blocks thereof according to instructions of the controller and the program address. When the flash memory receives a read command from the controller, the flash memory reads data from pages of the blocks thereof according to the instructions of the controller and the program address, and then issues read-out data back to the controller. However, if an unexpected situation occurs when the data is stored into the flash memory, the programming operation may result in failure. If the controller cannot instantly detect that the programming operation has failed, it may be because the read data is wrong.

Therefore, a detection method to determine whether a programming operation of a flash memory is normal is desirable.

BRIEF SUMMARY OF THE INVENTION

A data storage device and a detection method for detecting a programming operation of a flash memory are provided. An embodiment of a data storage device is provided. The data storage device comprises a flash memory and a controller. The flash memory comprises a memory array. The controller performs a programming operation for the flash memory. After the controller issues a program command of the programming operation to the flash memory, the controller issues a first read status command to the flash memory before a page program time of the flash memory has been reached, and the controller determines whether the programming operation is performed in the flash memory according to a first memory status provided by the flash memory.

Furthermore, an embodiment of a detection method for detecting a programming operation of a flash memory is provided. A program command of the programming operation is issued to the flash memory, by a controller. A first read status command is issued to the flash memory before a page program time of the flash memory has been reached, by the controller. It is determining whether the programming operation is performed in the flash memory according to a first memory status corresponding to the first read status command provided by the flash memory.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
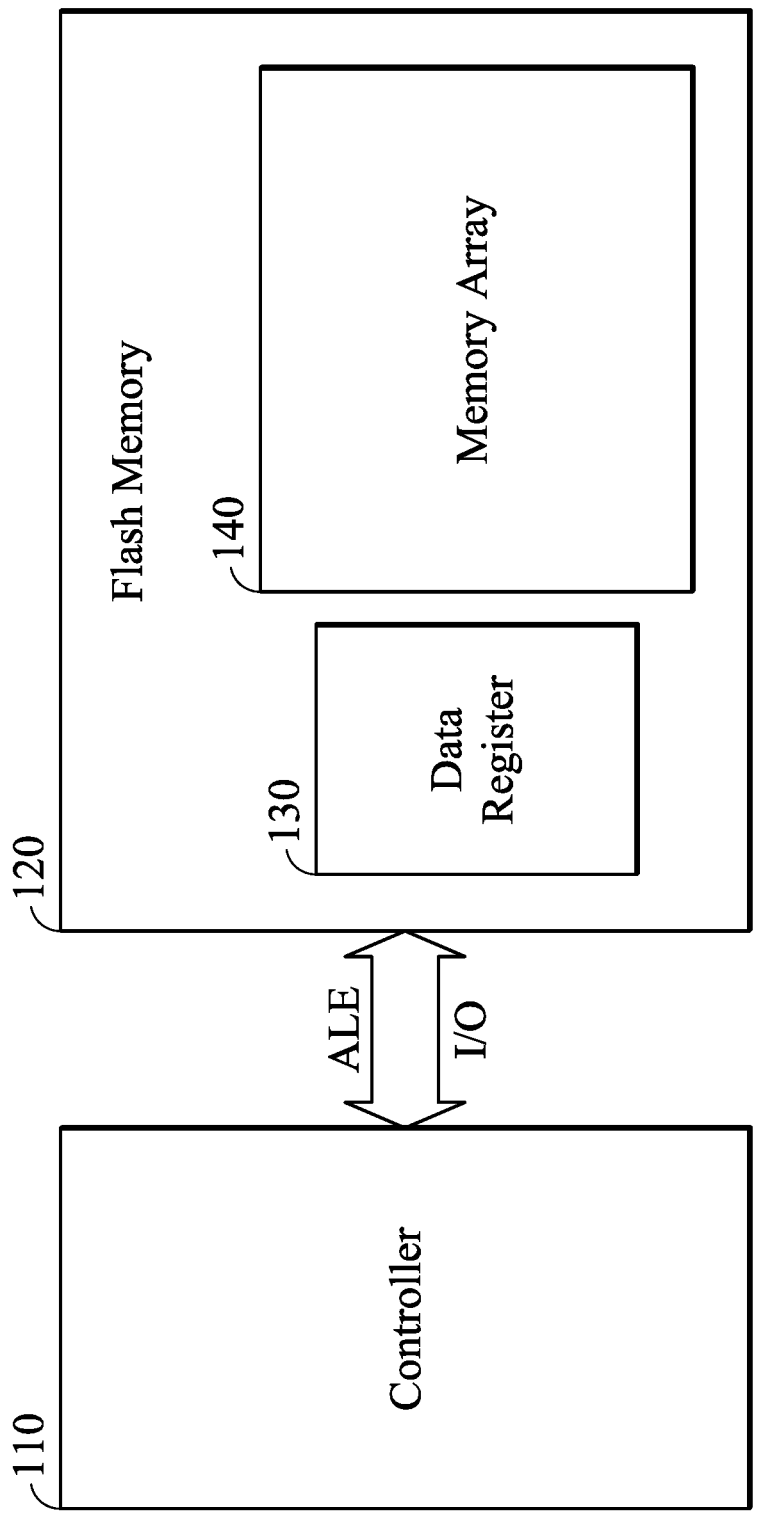
FIG. 1 shows a data storage device according to an embodiment of the invention.

FIG. 1 shows a data storage device 100 according to an embodiment of the invention. The data storage device 100 comprises a controller 110 and a flash memory 120, wherein the flash memory 120 comprises a data register 130 and a memory array 140 formed by a plurality of memory cells. In one embodiment, the data register 130 may be a cache register. The data storage device 100 can be implemented in different electronic apparatus, so that various devices within the electronic apparatus can access the data storage device 100 to perform specific functions. In response to the commands from the other devices (e.g. a master device) of the electronic apparatus, the controller 110 can access the memory array 140 of the flash memory 120. For example, when a master device will write data into the data storage device 100, the controller 110 performs a programming operation in response to a write command from the master device, so as to store the data from the master device into the memory array 140. If the programming operation has failed, the data storage device 100 will notify the master device, thus the master device can re-write the data into the data storage device 100 or perform subsequent operations. Details of how the controller 110 detects the programming operation for the flash memory 120 are described below.

Traditionally, a controller can obtain the status of a flash memory via the flash memory, to determine whether a programming operation of the flash memory has succeeded. For example, if the status of the flash memory is "E0h", the flash memory has succeeded, wherein "E0h" represents that the flash memory is idle, i.e. the flash memory has completed the programming operation and then the flash memory enters an idle mode. Conversely, if the status of the flash memory is "E1h", the flash memory has failed. However, in the programming operation, if an unexpected situation occurs, the flash memory may remain in the idle mode without entering a busy mode. Thus, the controller can obtain the status "E0h" of the flash memory, and then it makes an erroneous determination that the programming operation has succeeded. Compared with a traditional controller, the controller 110 of FIG. 1 can detect whether the flash memory enters a busy mode in a programming operation, thereby avoiding the erroneous determination.

Figure 2:
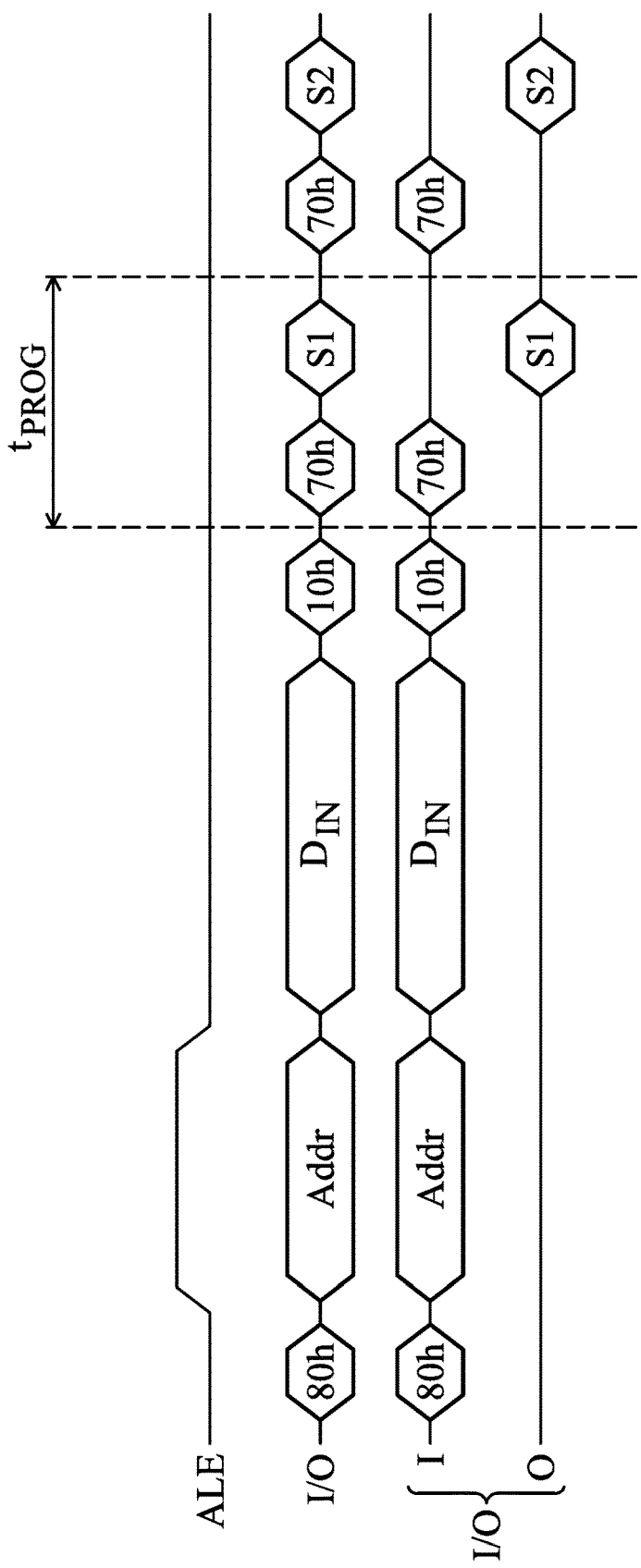
FIG. 2 shows an exemplary waveform diagram illustrating the signals between the controller and the flash memory of FIG. 1 according to an embodiment of the invention.

FIG. 2 shows an exemplary waveform diagram illustrating the signals between the controller 110 and the flash memory 120 of FIG. 1 according to an embodiment of the invention. In the embodiment, a signal ALE represents an address latch enable signal. A signal I/O represents the signal transmitted in an input/output bus. For convenience of explanation, the signal I/O is divided into a signal I and a signal O, wherein the signal I represents the signal transmitted from the controller 110 to the flash memory 120 in the input/output bus, and the signal O represents the signal transmitted from the flash memory 120 to the controller 110 in the input/output bus. In the embodiment, when performing a programming operation, the controller 110 can issue "80h", "Addr", "$D_{IN}$" and "10h" to the flash memory 120 via the input/output bus in sequence. In the embodiment, "80h" represents a serial data input command, "Addr" represents a program address, "$D_{IN}$" represents the program data, and "10h" represents a program command. Furthermore, when the controller 110 issues the program address Addr to the flash memory 120, the controller 110 also enables the signal ALE. After issuing the program command "10h" to the flash memory 120, the controller 110 will instantly issue "70h" to the flash memory 120, wherein "70h" represents a read status command. In response to the read status command, the flash memory 120 provides the current status S1 to the controller 110, i.e. the flash memory 120 will provide/return the status to the controller 110. Thus, the controller 110 can determine whether the programming operation is performed in the flash memory 120, i.e. it is determined whether the flash memory 120 enters a busy mode. If the flash memory 120 does not enter the busy mode, the controller 110 determines that the programming operation has failed (e.g. the status S1 is "E0h"), and then the subsequent operations are performed. It should be noted that the controller 110 issues the read status command to the flash memory 120 and receives the status S1 from the flash memory 120 before a page program time $t_{PROG}$ of the flash memory 120 has been reached. In the flash memory 120, the page program time $t_{PROG}$ represents the shortest time that the data register 130 stores the program data $D_{IN}$ into the memory array 140 according to the program address Addr. In one embodiment, the controller 110 uses a timer to count time after issuing the program command, so as to receive the status S1 during the page program time $t_{PROG}$. Conversely, if the flash memory 120 enters a busy mode (e.g. the status S1 is "80h"), the controller 110 issues the read status command "70h" to the flash memory 120 again after reaching the page program time $t_{PROG}$. In response to the read status command, the flash memory 120 provides the current status S2 to the controller 110, i.e. the flash memory 120 returns the status to the controller 110. Thus, the controller 110 can determine whether the programming operation has succeeded in the flash memory 120, i.e. it is detected whether the flash memory 120 enters an idle mode. If the flash memory 120 does not enter the idle mode (e.g. the status S2 is "E1h"), the controller 110 can determine that the programming operation has failed, and then the subsequent operations are performed. Conversely, if the flash memory 120 enters the idle mode (e.g. the status S2 is "E0h"), the controller 110 determines that the programming operation has succeeded.

Figure 3:
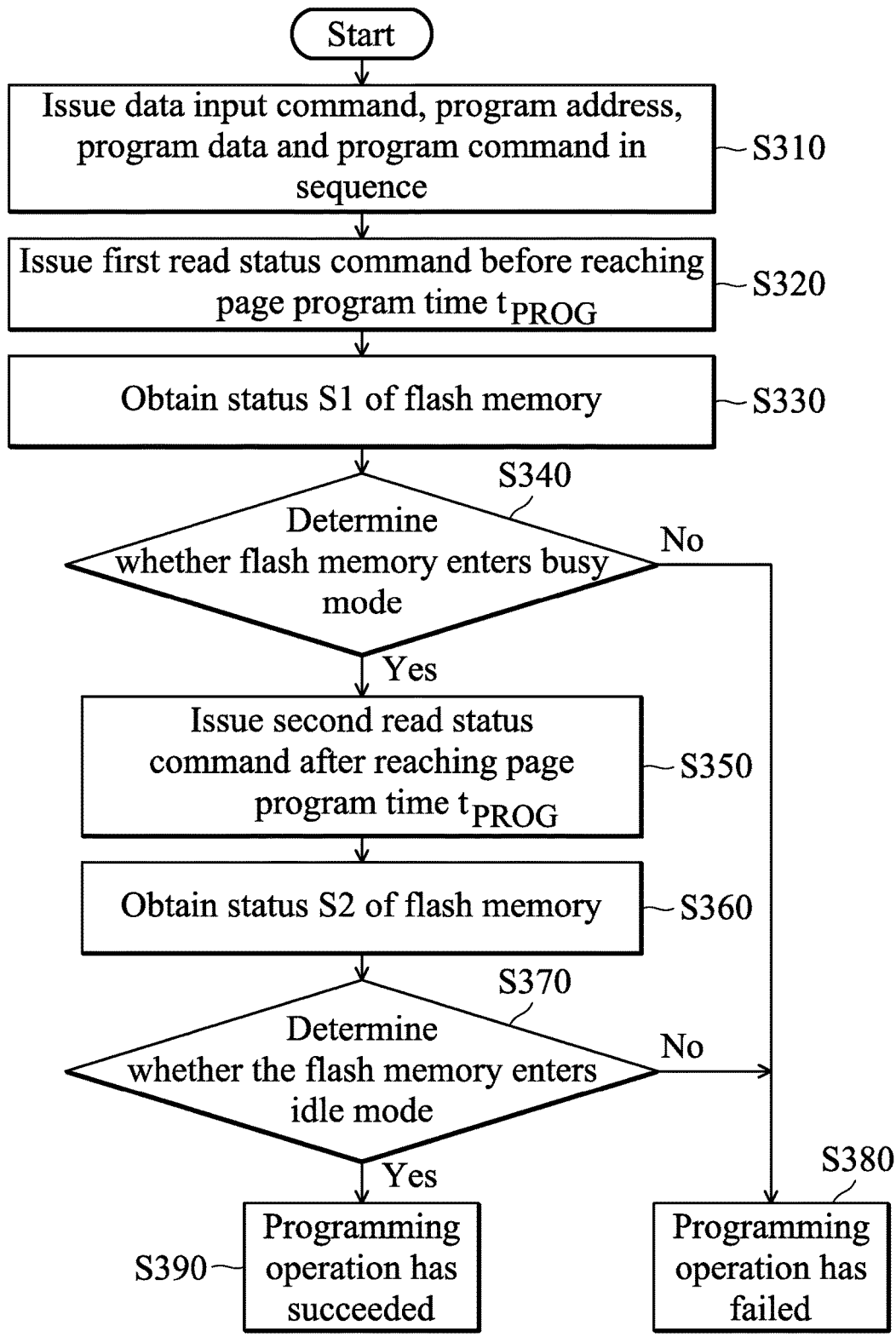
FIG. 3 shows a detection method for detecting a programming operation of a flash memory according to an embodiment of the invention.

FIG. 3 shows a detection method for detecting a programming operation of a flash memory according to an embodiment of the invention. In the embodiment, the detection method is performed by a controller of the flash memory. First, in step S310, the controller issues a data input command (e.g. "80h"), a program address, program data and a program command (e.g. "10h") to the flash memory in sequence, so as to control the flash memory to perform a programming operation. Next, before reaching the page program time $t_{PROG}$ of the flash memory, the controller issues a first read status command (e.g. "70h") to the flash memory (step S320), so as to obtain a status S1 returned by the flash memory (step S330). Next, in step S340, the controller determines whether the flash memory enters a busy mode according to the status S1, i.e. it is determined whether the status S1 is "80h". If the flash memory does not enter the busy mode, the controller determines that the programming operation has failed (step S380). Conversely, if the flash memory enters the busy mode, the controller 110 issues a second read status command (e.g. "70h") to the flash memory (step S350) after reaching the page program time $t_{PROG}$, so as to obtain a status S2 returned by the flash memory (step S360). Next, in step S370, the controller determines whether the flash memory enters an idle mode according to the status S2, i.e. it is determined whether the status S2 is "E0h". If the flash memory does not enter the idle mode (e.g. the status S2 is "E1h"), the controller determines that the programming operation has failed (step S380). Conversely, if the flash memory enters the idle mode, the controller determines that the programming operation has succeeded (step S390).

According to the embodiments of the invention, the controller can obtains a status of the flash memory during the page program time $t_{PROG}$. Thus, in the programming operation, when an unexpected situation occurs in the flash memory, the controller can accurately determine whether the programming operation is performed in the flash memory during the page program time $t_{PROG}$, and further determine whether the programming operation has succeeded.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, comprising a memory array; and
   a controller, performing a programming operation for the flash memory,
   wherein after the controller issues a program command of the programming operation to the flash memory, the controller issues a first read status command to the flash memory before a page program time of the flash memory has been reached, and before the page program time of the flash memory has been reached, the controller determines whether the programming operation is performed in the flash memory according to a first memory status, wherein the first memory status is provided by the flash memory in response to the first read status command,
   wherein when the controller determines that the programming operation is being performed in the flash memory, the controller issues a second read status command to the flash memory after exceeding the page program time of the flash memory, and the controller determines whether the programming operation has succeeded according to a second memory status provided by the flash memory.

2. The data storage device as claimed in claim 1, wherein when the first memory status indicates that the flash memory is idle, the controller determines that the programming operation has not been performed in the flash memory.

3. The data storage device as claimed in claim 2, wherein when the flash memory is idle, the first memory status provided by the flash memory is E0h.

4. The data storage device as claimed in claim 1, wherein when the first memory status indicates that the flash memory is busy, the controller determines that the programming operation is being performed in the flash memory.

5. The data storage device as claimed in claim 4, wherein when the flash memory is busy, the first memory status provided by the flash memory is 80h.

6. The data storage device as claimed in claim 1, wherein when the second memory status provided by the flash memory is E0h, the controller determines that the programming operation has succeeded.

7. The data storage device as claimed in claim 1, wherein when the second memory status provided by the flash memory is E1h, the controller determines that the programming operation has failed.

8. The data storage device as claimed in claim 1, wherein before issuing the program command of the programming operation, the controller further issues a serial data input command, a program address, and program data to the flash memory.

9. The data storage device as claimed in claim 8, wherein in the programming operation, the flash memory stores the program data into the memory array according to the program address in response to the program command.

* * * * *